United States Patent [19]

Adams et al.

[11] Patent Number: 5,102,356

[45] Date of Patent: Apr. 7, 1992

[54] ELECTRICAL CONNECTOR HAVING BOARD RETENTION MEANS

[75] Inventors: Barbara A. Adams, Harrisburg; William H. Allman, Millersburg; Troy E. Conner, York; Donald L. Forker, Harrisburg; Edward J. Knittle, Jr., York; Douglas R. Sarver, Millerstown, all of Pa.

[73] Assignee: AMP Incorporated, Harrisburg, Pa.

[21] Appl. No.: 705,478

[22] Filed: May 24, 1991

[51] Int. Cl.$^5$ .............................. H01R 13/42
[52] U.S. Cl. ..................... 439/751; 29/879; 439/83
[58] Field of Search .................. 439/81–83, 439/751, 876; 29/874

[56] References Cited

U.S. PATENT DOCUMENTS

| | | | |
|---|---|---|---|
| 2,994,057 | 7/1961 | Donohue et al. | 439/83 X |
| 3,524,108 | 8/1970 | English | 317/101 |
| 4,735,587 | 4/1988 | Kirayoglu | 439/751 |
| 4,847,588 | 7/1989 | Doutrich | 439/751 |

FOREIGN PATENT DOCUMENTS

| | | |
|---|---|---|
| 72485 | 6/1981 | Japan . |
| 80087 | 5/1982 | Japan . |

*Primary Examiner*—Eugene F. Desmond
*Attorney, Agent, or Firm*—Katherine A. Nelson

[57] ABSTRACT

An electrical connector includes a housing and an array of terminal members having posts extending from the housing and adapted for insertion into through-holes of a circuit board. At least one board retention means is formed on at least one of the posts and is axially located a selected distance from the lower surface of the housing to be within a corresponding through-hole after insertion. The retention means is a swage defining wall engaging surfaces for engaging sidewalls of a respective through-holes during mounting of the connector to board. The swage is formed such that the far side of the post remains coplanar with the axially adjacent surfaces and a swage embossment extends laterally outwardly from at least the second side, the embossment being formed by the work end of a tool striking the third side at an angle. In the preferred embodiment, there are at least two swaged posts with embossment of the first terminal extending outwardly in a first direction and the embossment of the second post extending in a second opposing direction. The retention means of the first and second posts engage wall surface within respective through-holes with spring bias applied in opposite directions thereby defining means for temporarily securing the connector to the board prior to soldering.

7 Claims, 9 Drawing Sheets

ELECTRICAL CONNECTOR HAVING BOARD RETENTION MEANS

FIELD OF THE INVENTION

This invention relates to electrical connectors of the type having a connector body and a plurality of posts extending from one side of the body for mounting to a circuit board and more particularly to a retention feature for temporarily holding the connector in place on the board prior to soldering.

BACKGROUND OF THE INVENTION

Japanese UM Publication No. 72485/81 discloses an electrical connector having a retention feature in which the posts have outwardly extending projections that have been formed by compressing parts of the side surfaces upon insertion of the terminals into a board, the projections provide force against the sidewalls of a through-hole of a circuit board to secure electrical connector to the board during the soldering process. As is known in the art, compressed or coined areas are typically formed during the terminal stamping process by applying force from opposed directions to flatten the selected areas. Since force needs to be applied from both sides of the terminal, the coined area is generally formed prior to insertion of the terminals into the housing, particularly if the coined terminals are being used in a multi-row connector. The coined terminals are then placed in the housing at selected locations to provide a desired amount of retention force. Depending upon the dimension of the coined area, the connector may be secured to the board by interference fit of one or more individual terminals or by two or more terminals that cooperate with one another. Assembly of a connector of this type is labor intensive, in that the coined terminals need to be individually loaded, into the housing at selected locations. It is desirable, therefore, to provide electrical connector wherein retention means can be provided by a post connector assembly operation.

The amount of force necessary to coin a terminal depends upon the thickness or stiffness of the material. In addition, when coined areas are applied to relatively stiff posts such as posts having cross sectional dimensions of 0.025 × 0.025 inches, problems have been encountered owing to the fact that the through-hole geometry of the circuit board varies within a range of tolerances, and the retentive coined feature must function properly throughout the range. If the terminal is held in the hole with an interference fit, the force required to insert a connector into the minimum size holes within the tolerance range may be extremely high relative to the force for the nominal or maximum size holes of the range. Conversely, if the force is not sufficient, the terminals will not be sufficiently secure within the maximum size hole to hold the connector to the board during wave or other soldering process.

SUMMARY OF THE INVENTION

Accordingly, this invention is provided to alleviate problems associated with the connectors of the type described above. The electrical connector of the present invention includes a housing means having a plurality of terminal members therein disposed in an array having at least one row. The terminal members have board connecting contact sections extending beyond the mounting face including at least one first and one second contact section at least proximate the first and second ends of the row. The first and second contact sections further include board retention means formed thereon axially located a selected distance from the mounting face preferably to be within the corresponding through-hole of a board when the connector is mounted thereto. The retention means of the first contact section is swaged in one direction and the retention means of the second contact section is swaged in a second direction, the swage defining wall engaging surfaces for the engaging sidewalls of the through-holes during the mounting of the connector to the board. Upon full insertion of the contact sections into the board, they apply spring bias in opposite directions for temporarily securing the connector to the board prior to soldering. Alternatively, the retention means may be located below the board, the swages also providing retention force against the lower surface of the board.

The invention is also directed to a method of swaging terminal posts, the posts having first and third opposed side portions parallel to the row of terminals and second and fourth opposed side portions transverse to the row. The swaging process includes the steps of: supporting the first side portion of a post to be swaged, and striking the third side portion at a selected axial location therealong with a forward end of a work tool such that the material is bulk deformed. An indentation is formed thereby on the third side portion and an embossment extends laterally outwardly from at least the second side portion of the post, the embossment including a portion remaining coplanar with axially adjacent surfaces of the first side portion. By orienting swages on selected posts of a connector such that the embossment of at least one first post extends in a first direction generally parallel to a row of terminal members and the embossment of at least one second post extends in a second generally opposed direction and mounting the connector to a board, the embossments engage wall surfaces within respective through-holes with spring bias applied in generally opposite directions to temporarily secure the connector to the board prior to soldering.

The retentive feature of the posts of the present invention can be applied in a post assembly operation. The retention feature comprises a swaged portion having one side flat, an opposing inwardly directed arcuate section and outwardly extending embossments along the opposed sides. In the preferred embodiment the swage forms a depression in the terminal configured so that the embossment on one side is considerably greater in size than the embossment on the other side. The swage is offset to allow the terminal member to have some freedom of movement within hole to accommodate the minimum hole as well as the larger hole sizes that occur within a typical tolerance range, for example 0.040 + or −0.003 inches. This design of the swage reduces insertion forces as compared to those typically present with an interference fit.

Further advantages and specific details of the invention will become apparent herein by way of example in the following detailed description of the preferred embodiments taken in conjunction with the drawing.

DETAILED DESCRIPTION OF PREFERRED EMBODIMENT

Figure 1:
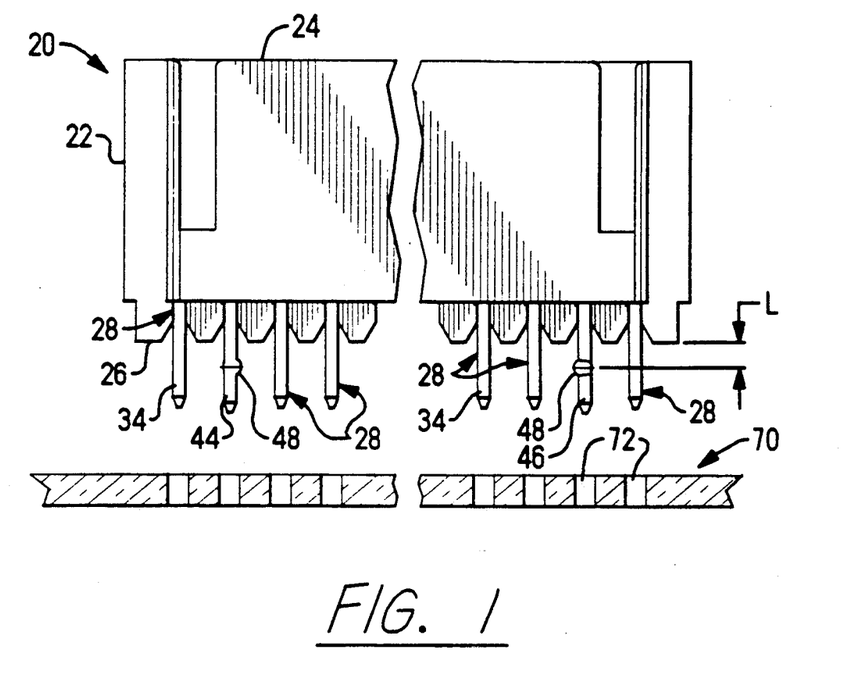
FIG. 1 is a side view of a connector having the retention means made in accordance with the invention and exploded from a circuit board.
Figure 2:
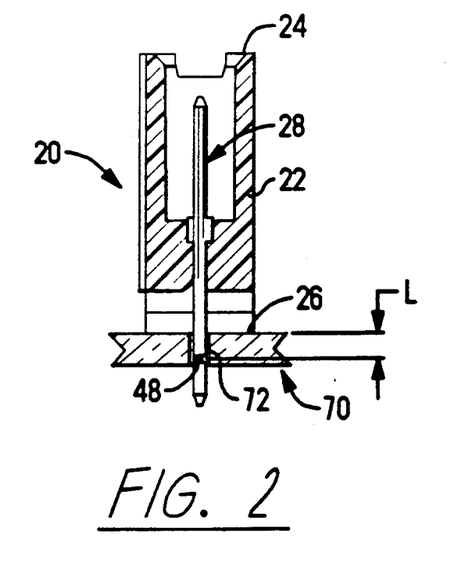
FIG. 2 is a cross sectional view of the connector of FIG. 1 mounted to a circuit board and illustrating the retention means of the present invention.

Referring now to FIGS. 1, 2, 3 and 4, electrical connector 20 includes a housing means 22 and a plurality of terminal members 28 disposed in an array having portions 34 thereof that extend below the housing for mounting to a circuit board 70. In accordance with the invention as shown in FIG. 1 at least two of the terminal members include retention means 48 for temporarily retaining the connector 20 to a circuit board 70 during the wave soldering process. In the preferred embodiment the retentive means 48 is positioned a selected axial length "L" along the respective terminal member 28 to assure that the retentive feature lies within the corresponding circuit board hole 72 as shown in FIG. 2. It is to be understood that the retention means may also be positioned along the terminal member such that the swage lies below the through-hole of the board.

Housing 22 is comprised of a dielectric member having mating and mounting faces 24,26 respectively. The invention is being shown representatively in a connector known as a shrouded pin header. It is to be understood that the retentive feature is applicable to other types of connectors as well.

Figure 3:
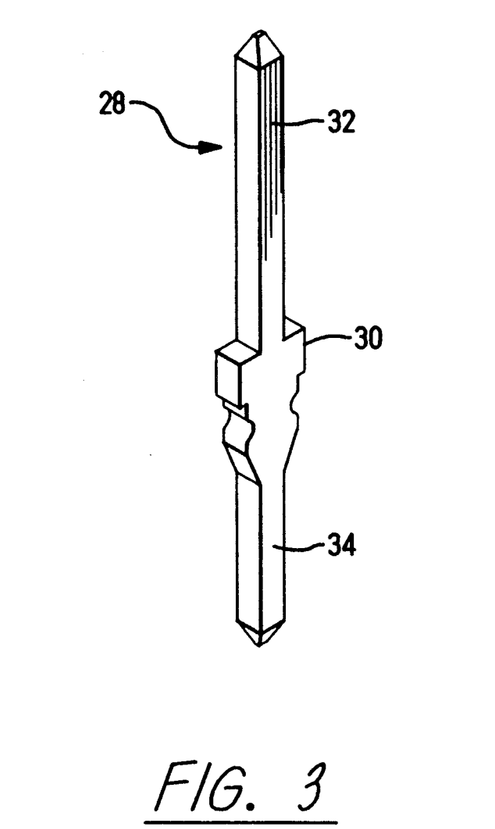
FIG. 3 is a perspective view of a terminal member removed from the connector of FIG. 1.
Figure 4:
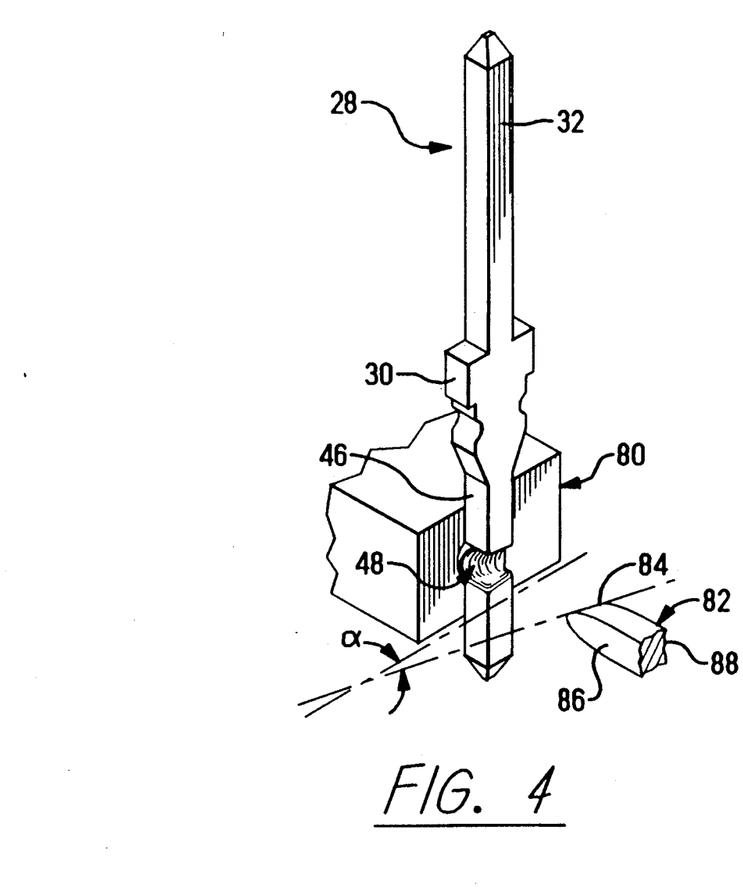
FIG. 4 illustrates the method used to make the retentive feature or swage in the terminal of FIG. 3 and shows the punch portion of a tool used to form the swage.
Figure 5:
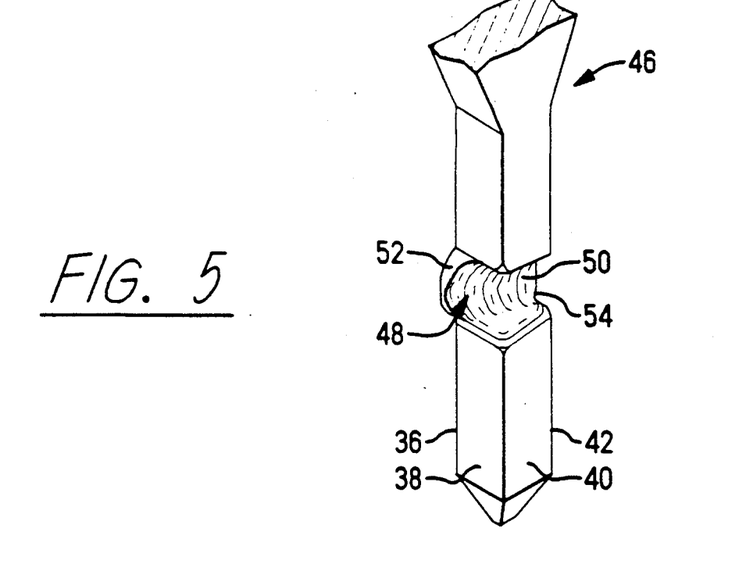
FIG. 5 is an enlarged view of the retentive or swage feature of FIG. 4.

The structure of the terminal members 28 is shown in FIG. 3. Each terminal member 28 includes a center body portion 30; a mating connecting portion 32, which extends from body portion 30 toward the mating face 24; and a board connecting contact portion 34, which extends below the mounting face 26. The board connecting portions 34 of selected ones 44,46 of the terminal members 28 further include retentive means 48, for securing the connector 20 to the board 70 during soldering as shown in FIG. 2. The details of the forming of the retentive means are best understood by referring to FIGS. 4 and 5. FIG. 4 illustrates the process for forming the retentive means or swage 48. In accordance with the invention a retentive feature or swage 48 is struck into selected terminal members 28 after the connector 20 has been completely assembled. For purposes of illustrating the swage 48, the terminal member 28 has been removed from the housing. As shown in FIGS. 3, 4 and 5 the board connecting portion or post 34 is a four sided member having sides 36, 38 40 and 42. It is to be understood the shape of the post is not to be limited to those having a square or rectangular cross section. As shown in FIG. 4 a flat plate 80 is placed behind the terminal member 28 selected to be swaged. A swaging anvil or punch 82 is struck against the post 34 with a force of about 100 lbs per terminal member. The forward end 84 of the work tool 82 is blade-shaped having opposed first and second blade sides 86,88 to strike a the terminal post transversely with respect to the post axis, and the blade-shaped forward end is angled from the first blade side 86 to the second blade side 88, shown as "α" in FIG. 4, whereby the blade-shaped forward end 84 initially engages the third side portion 40 of the post proximate the second side portion 38 thereof thereby bulk deforming the embossment toward the second side portion 38 of the post, as best seen in FIG. 5. The radiused surface 84 of anvil 82 engages the third side 40 of the post 34 to form an indented surface 50 thereon. The material of the standard post is bulk deformed in the board contact section 34 away from the third side 40 such that outwardly extending embossments 52,54 result along the second and fourth sides 38,42 and a corresponding indentation 50 results along the third side.

As can be seen in FIG. 5, the swaged embossments 52,54 extend laterally outwardly from the second and fourth sides 38,42 and the far side of the embossments 52,54 remain essentially coplanar with the axially adjacent surfaces of the first side 36 of the post 34. Since the punching tool 82 has a radiused surface 84, the greater portion of the bulk deformation occurs along the second side 38 of the post as illustrated in FIG. 5, thereby creating a larger embossment 52 on one side 38 of the terminal member 28 as compared with the other side 42.

Figure 6:
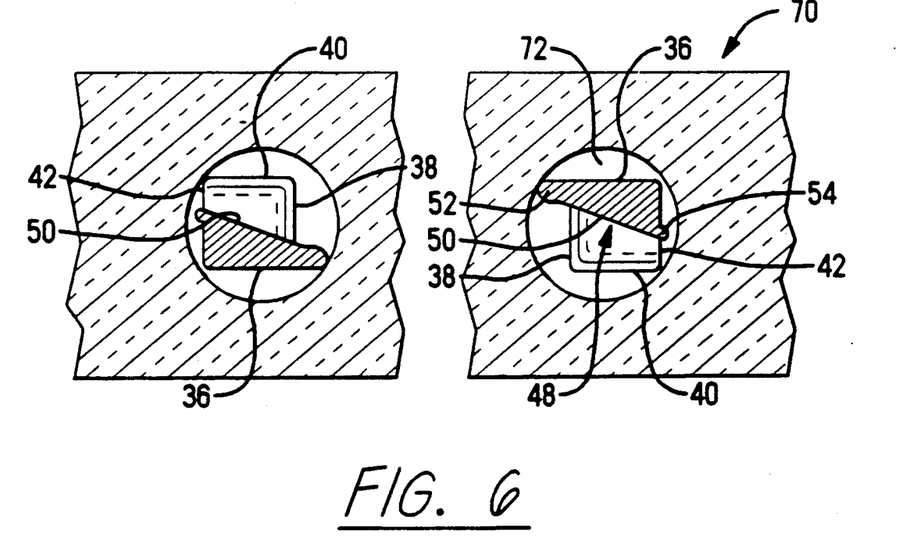
FIG. 6 is a fragmentary enlarged sectional view taken through the circuit board and illustrating the position of the retention terminals of the connector of FIG. 1 after mounting to the board.
Figure 7:
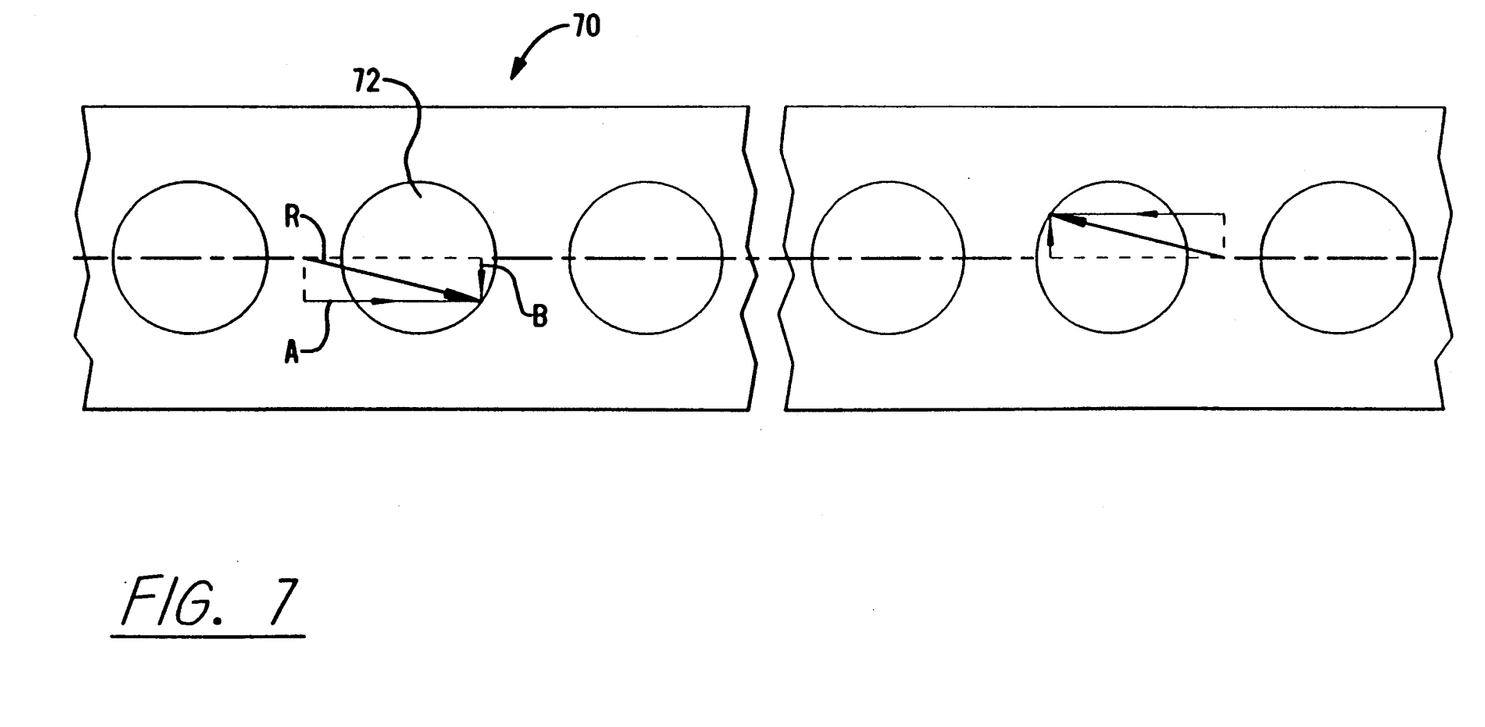
FIG. 7 is a view similar to FIG. 6 illustrating the force vectors of the retentive features.

FIG. 6 is a cross sectional view of the circuit board 70 illustrating the shape of the first and second retentive legs 41,46 and their corresponding embossments 52,54 as they are located with the corresponding holes 72 of the circuit board 70. FIG. 7 illustrates the resultant forces R exerted by the retentive legs 44,46 of FIG. 6, wherein A is the force exerted in the "X" direction, or parallel to the row of terminal members and B is the force exerted in the "Y" direction or perpendicular to the row of terminal members. As can be seen from FIG. 7, the forces exerted in the corresponding holes 72 by the respective retentive legs 44,46 are laterally offset from the centerline of the terminal members 28 of connector 20 thereby centering the connector 20 on the board 70 with sufficient retention to permit soldering by processes known in the art.

Figure 8:
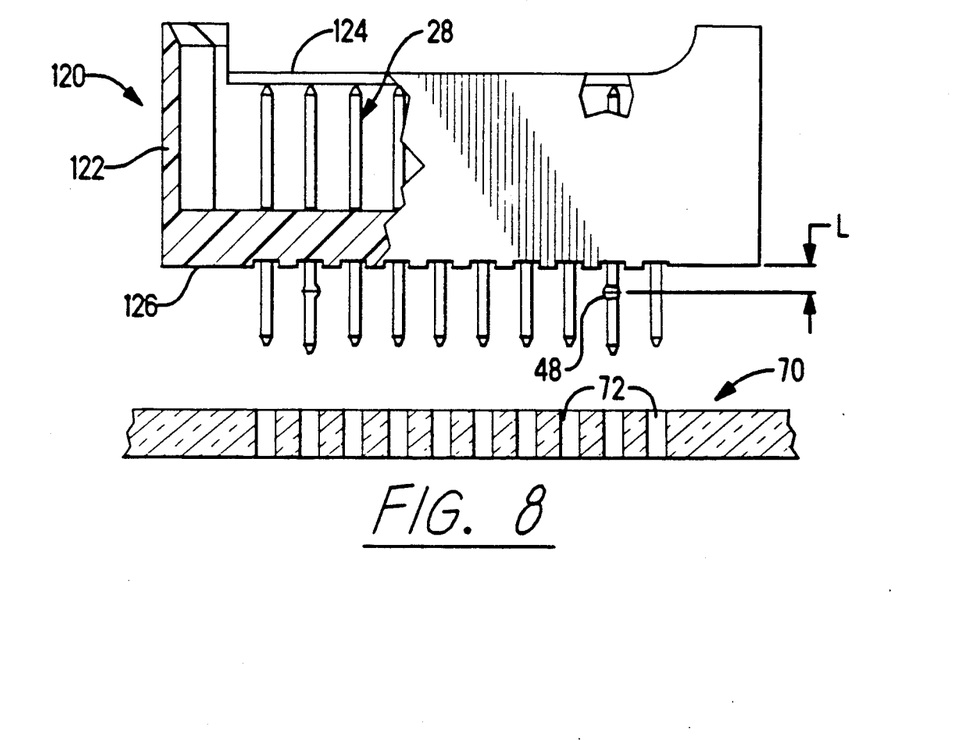
FIG. 8 is a partially sectioned view of a two row connector having retention means made in accordance with the invention.
Figure 9:
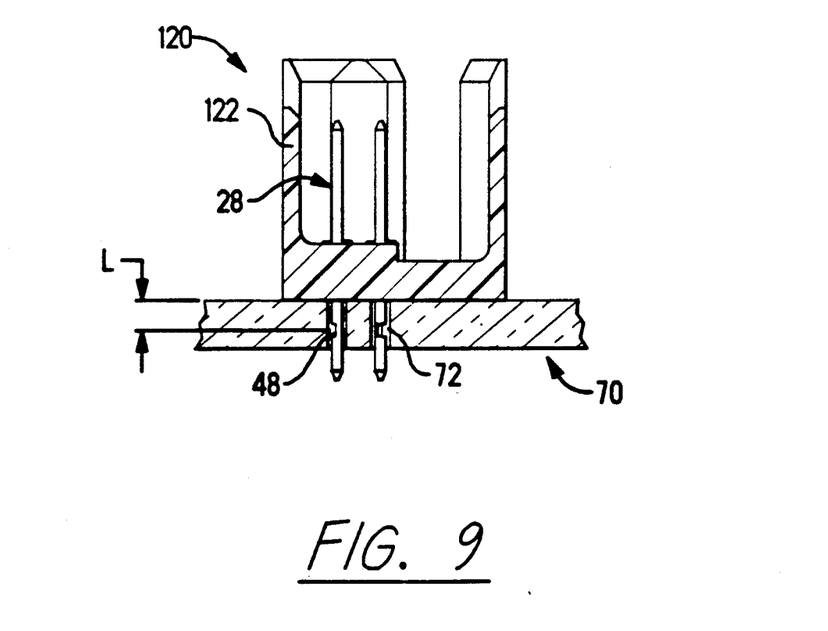
FIG. 9 is a cross sectional view of the connector of FIG. 8 as mounted to a circuit board and illustrating the terminal members having the retentive feature.

FIGS. 8 and 9 illustrate a two row connector 120 having retentive legs 44,46 made in accordance with the invention. In embodiment 120, housing 122 includes multiple rows of terminal members 28, which for illustrative purposes is shown as two. In FIG. 8 the connector 120 is shown partially in section thereby showing the back row of terminal members 28 on the lefthand side and the front row of terminal members 28 on the righthand side. In the preferred embodiment, each outer row has at least one retentive leg means and preferably are arranged in pairs such that the outer most rows of terminal members 28 in each column of terminal members of a connector have retentive features. The pairing of retentive terminal members 28 is illustrated in FIG. 9, a cross sectional view of the connector of FIG. 8 after mounting to the board 70. In multi-row connectors, it is generally desirable to have selected terminal members in the outer most rows of terminals provided with retentive means to balance the forces and essentially center the connector at its location on the board. For longer connectors is preferred to have additional opposed pairs of terminal members with swages to ensure that the connector is sufficiently secured through its entire length during the soldering process.

Figure 10:
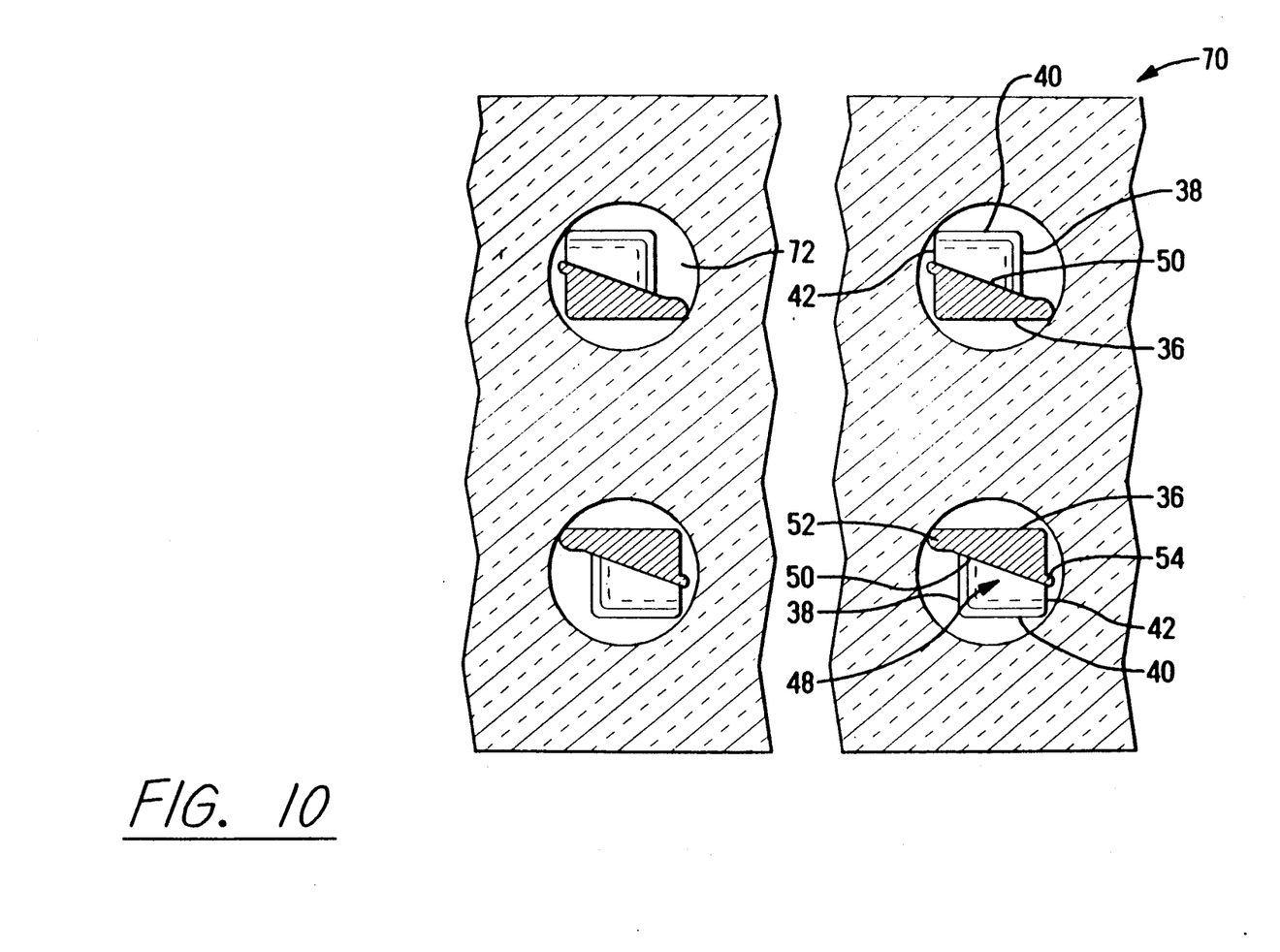
FIG. 10 is a view similar to that of FIG. 6 illustrating the orientation of the retentive legs of the connector of FIG. 8.
Figure 11:
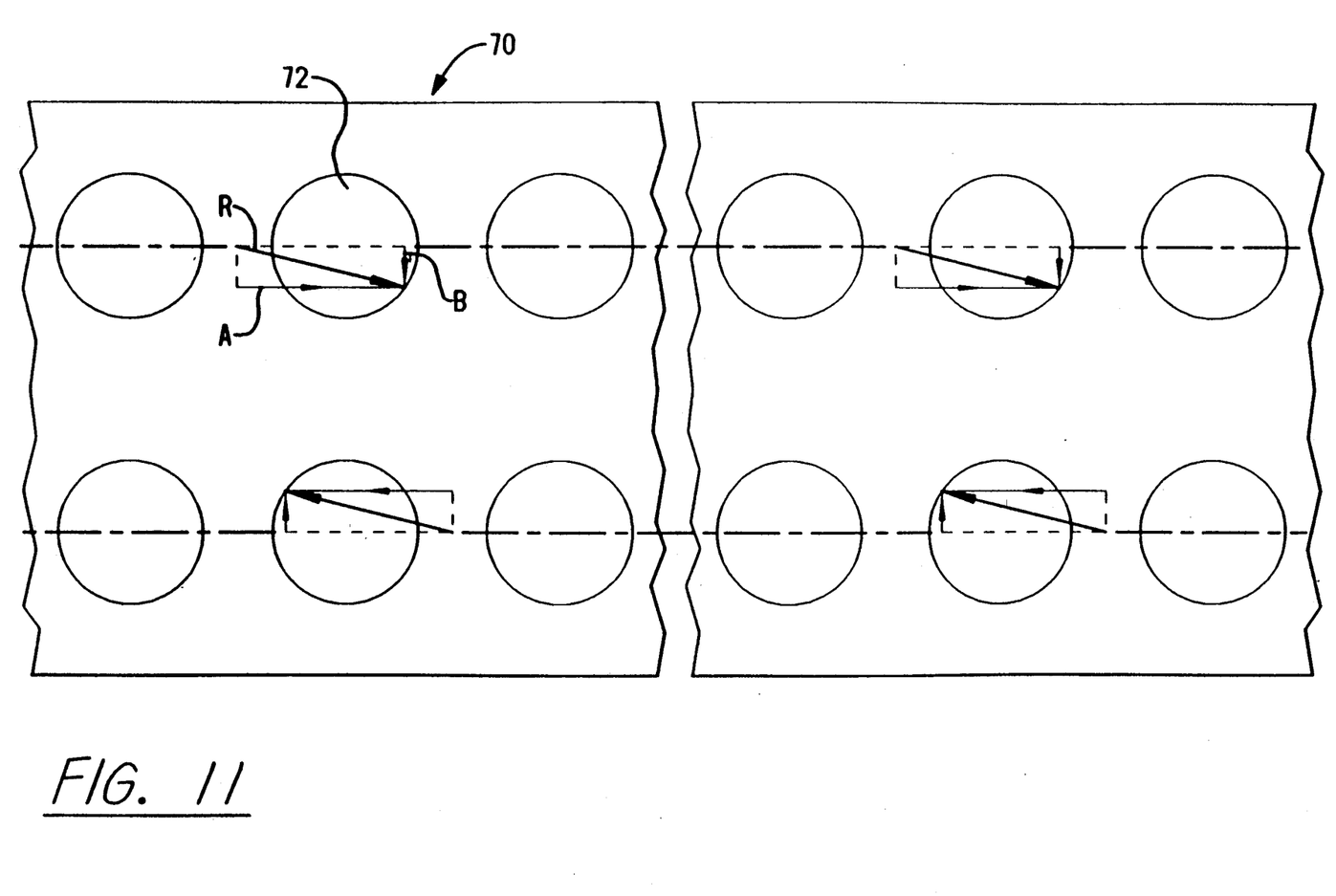
FIG. 11 is a pictorial representation of the force vectors of the double row connector of FIG. 8.

FIGS. 10 and 11 illustrate one arrangement of retentive terminal members 44,46 within a connector. As with the embodiment shown in FIGS. 6 and 7, the resultant force R, is laterally offset from the centerline of the connector, where A is the force exerted parallel to the row of terminals and B is the force exerted perpendicular to the row. When the retention means of the present invention is used in a multi-row connector all of the retentive features may be oriented in the same direction in one row and in an opposite direction in the other. This enables the same tool to be used as the connector moves through the assembly process. In swaging a two row connector the plate 80, as shown in FIG. 4, is located between the two rows of terminal members 28. The opposed pairs of terminal members 28 can then be swaged simultaneously. Approximately a 200 pound force is used to swage a pair of terminal members. It is to be understood that other orientations of the swage may also be used. In essence the direction of swages in the embodiment illustrated differs only in chirality. In the embodiment shown in FIGS. 8 through 11 the terminals front row have a left handed orientation, the terminals from the back row have a right handed orientation, the flat side being toward the longitudinal center line of the connector.

Figure 12:
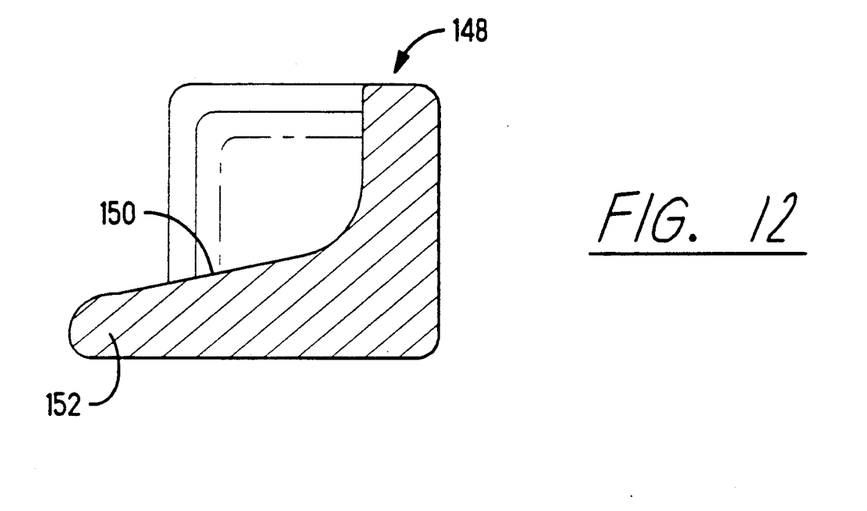
FIG. 12 is a sectional view of an alternative embodiment for the swage.

FIG. 12 illustrates an alternative embodiment 148 of the swage in which the punch tool (not shown) was struck against only a portion of the third side to form indentation 150 and force the material outwardly along only a second side forming embossment 152. It is to be understood that the shape of the swage may be configured to extend across the full width of a side of the post or only partially across and that the size and locations of the resultant embossments will be changed thereby.

Figure 13:
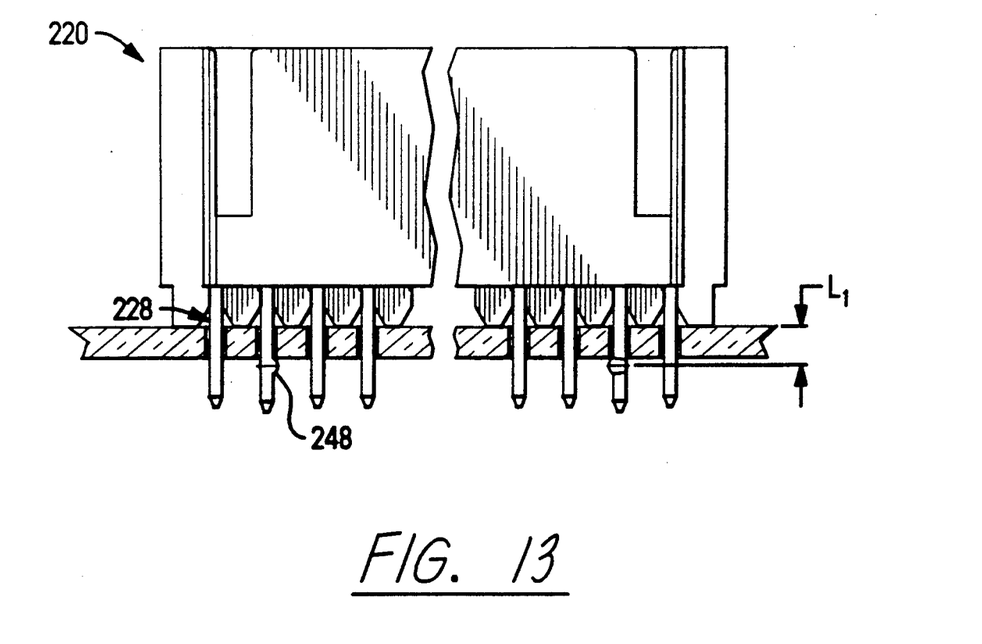
FIG. 13 is a cross-sectional view of a connector mounted to a board wherein the retention swages are located below the circuit board.
Figure 14:
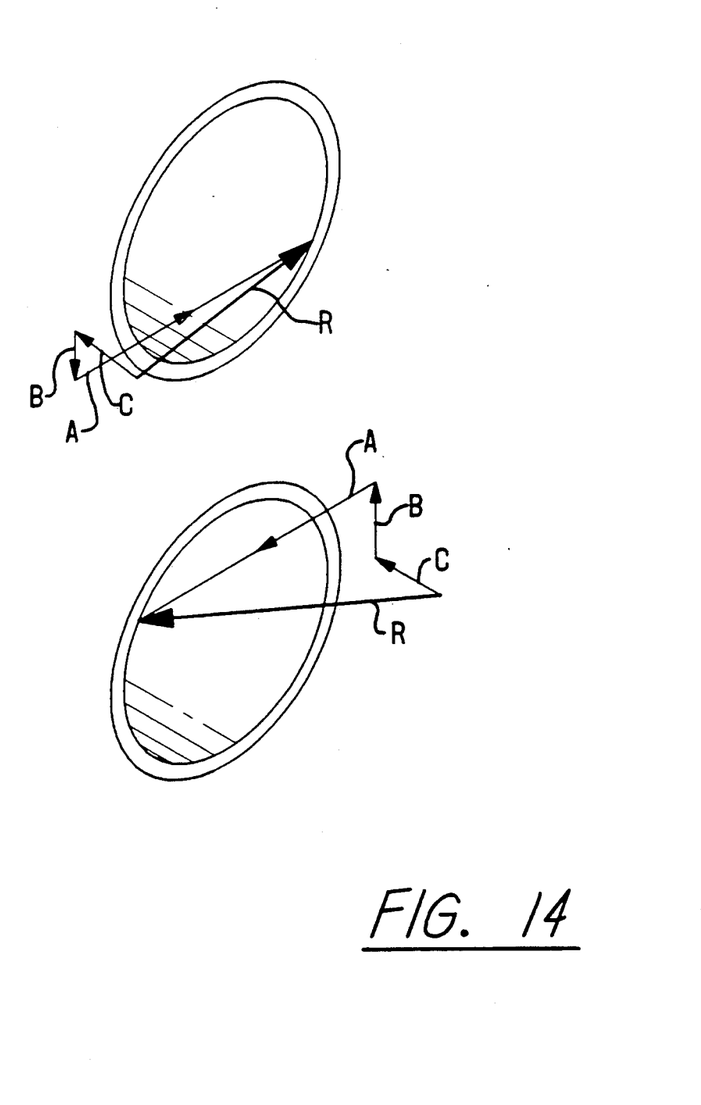
FIG. 14 is a pictorial representation of the force vectors of the retentive legs of FIG. 13.

FIGS. 13 and 14 illustrate a further embodiment 220 of the invention in which terminal members 228 are formed to provide retention swages 248 that are axially located at $L_1$ to lie below the circuit board 70 upon full insertion thereinto. The resultant forces R are shown in FIG. 14 wherein A shows the force in the "X" direction, B in the "Y" direction and C in the "Z" direction.

As is clearly shown in FIGS. 1 and 8, as bulk deformation occurs in the swaged terminal members, in addition to the outward expansion of the terminal, the terminal may also be slightly elongated. The amount of outward deformation and elongation is controlled to provide the desired amount of insertion force and retention force for the particular connector. By changing the shape of the punch or fixturing the terminals to minimize elongation, more material can be driven outwardly to provide a wider swage as shown in FIG. 12. In the preferred embodiment, approximately one-half of the thickness of the material is deformed in the two directions. As can be seen from FIG. 4, the swage can be thicker at one side than the other, which is caused by the angular shape of the punch. The angle of the punch may be varied over a range from 0 to about 45°. As is shown in FIG. 12, an essentially straight punch may be used when striking only a portion of the width of the post. The leading end of the tool, however, remains radiused to provide an arcuate surface.

In accordance with the invention the first and second retentive legs are substantially identical except that the swages are oriented in the opposite directions such that the greater amount of bulk deformation extends on the opposite direction between the first and second contact members. By balancing the forces, the connector can be centered within the board.

In making the connector in accordance with the invention, the connector is completely assembled prior to selectively swaging terminal members. The housing member is made from a dielectric material such as glass filled nylons, glass filled polyesters, liquid crystal polymers or the like, as known in the art. The terminals members are stamped from phosphor bronze or other suitable material, as known in the art. Typically the board connecting posts 34 are plated with tin and the mating portions 32 are plated with gold. The shape of the tool for punching or striking the swage of the present invention is selected and controlled such that the terminal members may be swaged without breaking or cracking the tin plating. This aids in the solderability of the terminal members. The terminal members 28 are then assembled in the housing and the selected terminal members are provided with the swage feature. The backing plate is inserted behind the selected terminal members for a single row connector and between terminal members in a double row connector and the tool is brought into engagement to form the swage. In multi-row connectors as best seen in FIG. 10, the flat part of each of the swaged terminal members is toward the other rows in the terminal array.

The present invention gives an advantage of being able to selectively swage the number of and select the location of the retentive feature for individual connector members. As previously stated, by using a radiused punch, the swage can be formed without breaking the plating. For ease of swaging the present invention allows all of the swages in one row to be placed in the same orientation thus eliminating multiple tools for applying the swage. The swages on the other side of the connector can be made with a similar tool or the connector can be turned around and the other side passed through the initial tool as the connector moves through the assembly process.

The present invention further provides advantages over the coining of the prior art in which the coining typically was done by applying the forming force to both sides of the terminal member. Furthermore, the deformations and force produced by the prior art coining process would generally crack the plating layer on a pre-plated terminal For this reason, terminal members would be coined prior to plating. While it was possible to coin assembled connectors having only a single row of terminals, the size of the equipment necessary for coining the terminals caused problems when used to coin terminals in an assembled multi-row connector. It was, therefore, typical to coin the terminal members separately, plate them and then insert them into the housing.

The present invention overcomes the problems the prior art in that it allows bulk deformation of terminals after assembly of the terminals in a housing and furthermore allows selectivity within the row rather than limiting access to end terminals. The swage of the present invention furthermore gives advantage of retaining the continuous layer of plating thereby assuring good solderability.

It is thought that the retention means of the present invention and many of its attendant advantages will be understood from the foregoing description. It will be apparent that various changes may be made in the form, construction and arrangement of the parts thereof without departing from the spirit or scope of the invention or sacrificing all of its material advantages. The form herein described is a preferred or exemplary embodiment thereof.

We claim:

1. An electrical connector wherein board connecting contact sections of terminal members are adapted for insertion into through-holes of a circuit board for soldering to circuit means of said board, said connector comprising:

housing means having mating and mounting faces;
   a plurality of terminal members disposed in an array having at least one row in said housing means, said terminal members having board connecting contact sections extending beyond said mounting face, including at least one first and one second said contact section at least proximate first and second ends respectively of said array of terminal members;
   each said first and second contact section further including board retention embossments formed thereon axially located a selected distance from said mounting face to be within a corresponding said throughhole after insertion to define wall engaging surfaces for engaging sidewalls of respective said through-holes during mounting of said connector to said board;
   the material of each said first and second contact section being bulk deformed such that an indentation is formed on a third side, to express material outwardly from at least a second side and coplanar with a first side opposed from said third side to define said embossment,
   said retention embossment of said first contact section being swaged in a first direction and said retention embossment of said second contact section being swaged in a second opposing direction and upon full insertion of said contact section into said through-holes, said first and second retention embossments of said first and second contacts engaging wall surfaces within respective through-holes with spring bias applied in opposite directions defining means for temporarily securing said connector to the board prior to soldering.

2. The connector of claim 1 wherein said board connecting contact is a post having four sides, the post being swaged at a selected axial location, the swaged embossment being formed such that the first side of the post remains coplanar with the axially adjacent surfaces, the embossment being formed by the work end of a tool striking the third side at a angle.

3. The electrical connector of claim 1 wherein said array of terminal members includes a plurality of rows of terminal members.

4. A method for forming retention means for a connector of the type including a housing and an array of at least one row of terminal members having posts extending from the housing and adapted for insertion into through-holes of a circuit board for soldering to circuit means of said board, the method comprising the steps of:

selecting at least one first and one second terminal posts of said terminal members of said array for being swaged to define said retention means;
   swaging said selected first and second terminal posts, said posts having first and third opposed side portions parallel to said at least one row and second and fourth opposed side portions transverse to said at least one row, said swaging process with respect to each said selected first and second terminal post including the steps of:
   supporting said first side portion of said selected post; and
   striking said third side portion of said selected post at a selected axial location therealong with a forward end of a work tool such that the material is bulk deformed, an indentation is formed on said third side portion and an embossment extends laterally outwardly from at least said second side portion of said selected post, said embossment including a portion remaining coplanar with axially adjacent surfaces of said first side portion; and
   orienting said swages on said selected posts such that said embossment of said at least one first post extends in a first direction generally parallel to said at least one row and said embossment of at least one second post extends in a second generally opposed direction, said embossments defining wall- engaging surfaces for engaging sidewalls of respective said through-holes during mounting of said connector to said board; whereby
   upon mounting of said connector to said board and full insertion of said swaged posts into said through-holes, said first and second retention means of said first and second terminal members engage wall surfaces within respective through holes with spring bias applied in generally opposite directions defining means for temporarily securing said connector to the board prior to soldering.

5. The method of forming retention means of claim 4 wherein said work tool strikes said third side portion such that an embossment is also formed on said fourth side portion, said fourth side embossment extending laterally outwardly from said side and including a portion remaining coplanar with axially adjacent surfaces of said first side portion.

6. The method of forming retention means of claim 4 further including the step of providing said forward end of said work tool with a radius configured such that plating on said selected first and second terminal posts is not cracked by the swaging process.

7. The method of forming retention means of claim 6 further including the step of providing said forward end of said work tool with a blade shape having opposed first and second blade sides and striking a said terminal post transversely with respect to the post axis with said blade-shaped forward end being angled from said first blade side to said second blade side whereby said blade-shaped forward end initially engages said third side portion of said post proximate said second side portion thereof thereby bulk deforming said embossment toward said second side portion of said post.

* * * * *